United States Patent [19]

Bucska et al.

[11] Patent Number: 4,868,470
[45] Date of Patent: Sep. 19, 1989

[54] APPARATUS AND METHOD FOR DETECTING A TRUE AVERAGE OF N SIGNAL SAMPLES

[75] Inventors: Nicholas J. Bucska, Louisville; David E. Norton, Jr., Boulder, both of Colo.

[73] Assignee: MiniScribe Corporation, Longmont, Colo.

[21] Appl. No.: 197,114

[22] Filed: May 20, 1988

[51] Int. Cl.[4] .............................................. G05B 13/00
[52] U.S. Cl. ................................ 318/561; 360/77.04; 341/172; 341/150; 307/351
[58] Field of Search ...................... 318/561; 360/77.04; 341/172, 150; 307/351

[56] References Cited

U.S. PATENT DOCUMENTS

| | | | |
|---|---|---|---|
| 3,165,694 | 1/1965 | Young | 324/111 |
| 3,428,829 | 2/1969 | Haynie | 307/352 |
| 3,885,168 | 5/1975 | Matsuzaki | 307/351 |
| 4,075,558 | 2/1978 | Harzer | 324/99 R |
| 4,144,527 | 3/1979 | Butler et al. | 341/172 |
| 4,380,034 | 4/1983 | Krake | 360/77.04 |
| 4,563,637 | 1/1986 | De Bortoli | 324/77 A |
| 4,603,299 | 7/1986 | Monett | 328/151 |

Primary Examiner—William M. Shoop, Jr.
Assistant Examiner—Saul M. Bergmann
Attorney, Agent, or Firm—Curtis, Morris & Safford

[57] ABSTRACT

A true average peak detector includes an input capacitor having a capacitance C and an output capacitor having a capacitance nC. N voltage samples are successively stored on the input capacitor and are transferred to the output capacitor without discharging the latter. The output voltage from the accumulated charge on the output capacitor is equal to a true average of the voltages of the n samples.

15 Claims, 1 Drawing Sheet

APPARATUS AND METHOD FOR DETECTING A TRUE AVERAGE OF N SIGNAL SAMPLES

FIELD OF THE INVENTION

The present invention is directed to a true average peak detector and more specifically is directed to a method and apparatus for detecting a true average value of n signal samples, wherein n may be a small integer.

BACKGROUND OF THE INVENTION

In many applications it is desirable to provide a true average value of a relatively small number of signal samples. For example, in a tracking servo system for a hard disk drive device, a pattern is recorded in a servo area on the disk which, when reproduced, produces a series of pulses in a repeating pattern which represents the position of the servo head. The difference in pulse heights between particular pulses in each cycle of the pattern provides tracking information for centering the servo head over the track, and it is highly desirable to make an accurate measurement of the pulse heights within a short period of time to avoid errors in the servo control operation. In order to reduce noise problems that may be caused by a defect in the recorded servo pattern or in the servo head, corresponding pulses in a number of cycles of the pattern are averaged and the pulse height difference between the averaged pulses is used to adjust the position of the servo head to correct drift.

Since it is advantageous to be able to calculate the tracking information within a short period of time, generally pulses from only a small number of such cycles, for example four, are averaged. However, prior art averaging circuits have been unable to meet the combined requirement of speed and accuracy. A conventional peak hold system is sensitive to noise spikes, in that samples other than the sample in which the noise spike occurs may not contribute significantly to the detected value, thereby resulting in erroneous values due to the noise spike. A true integrating system, on the other hand, requires a large number of samples, as the time constant in the detector system must be long with respect to the rise time of the sampled pulse.

OBJECTS AND SUMMARY OF THE INVENTION

It is an object of the present invention to provide apparatus for detecting the true average value of a number of signal samples which avoids the above-described difficulties of the prior art.

It is another object of the present invention to provide apparatus and a method for detecting the true average of a small number of signal samples.

It is yet another object of the present invention to provide apparatus and a method for detecting the true average of a number of signal samples which is relatively insensitive to noise spikes because the influence noise spike is divided among the number of samples.

It is still another object of the present invention to provide apparatus for detecting a true average of a number of signal samples which has a simple construction.

It is a further object of the present invention to provide a tracking servo control system for a hard disk drive incorporating an improved apparatus for detecting a true average level of servo pulse samples.

In accordance with an aspect of the present invention, apparatus for detecting a true average of n signal samples, where n is an integer greater than 1, comprises input capacitor means having a first capacitance for successively storing the n signal samples, output capacitor means having a second capacitance equal to the first capacitance multiplied by n for presenting an output voltage, and transfer means for transferring each of the n signal samples from the input capacitor means to the output capacitor means for accumulating on the latter, whereby after transfer of the n signal samples the output capacitor means presents an output voltage equal to a true average of the n signal samples.

In accordance with this aspect of the present invention, a method for detecting a true average of n signal samples, where n is an integer greater than 1, comprises the steps of successively storing the n samples on an input capacitor having a first capacitance, transferring each of the stored samples from the input capacitor to an output capacitor having a capacitance equal to the first capacitance multiplied by n for accumulating on the output capacitor, and detecting a voltage on the output capacitor.

In a further development of the present invention, the second capacitance may be equal to the first capacitance multiplied by k, where k is not necessarily an integer or equal to n. In such case, the output voltage is equal to a true average of the n signal samples multiplied by a gain factor of n/k, resulting in a gain or attenuation depending on the values of n and k. For example, if the two capacitances are equal, the gain is n. The gain factor is therefore selectable at any desired value, but the average remains a true average.

In accordance with a further aspect the present invention finds ready application as an improvement in apparatus for tracking servo control of a hard disk drive device in which corresponding pulses of successively reproduced cycles of a tracking servo pattern are averaged to provide a tracking control signal. The improvement comprises input capacitor means having a first capacitance for successively storing n respective samples of n of said pulses, output capacitor means having a second capacitance equal to said first capacitance multiplied by n for presenting an output voltage, and transfer means for transferring each of the n samples from the input capacitor means to the output capacitor means for accumulating on the latter, whereby after transfer of the n samples the output capacitor means presents an output voltage equal to a true average of the n voltage samples.

These and other objects, aspects and features of the present invention will be made clear in the following detailed description of a preferred embodiment of the present invention taken in connection with the accompanying drawings, throughout which like reference numerals denote like elements and parts.

DETAILED DESCRIPTION OF THE PREFERRED EMBODIMENT

Figure 1A:
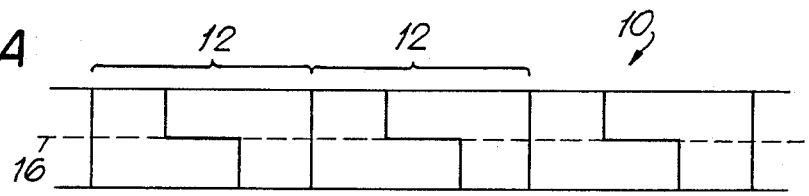
FIG. 1A is a schematic drawing of a tracking servo pattern recorded in a servo track on a hard disk and adapted to be reproduced by a reproducing head in a hard disk drive device.
Figure 1B:
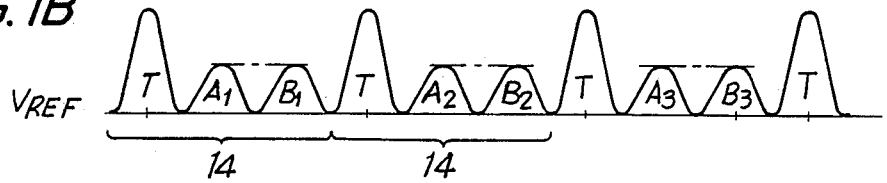
FIG. 1B is a waveform of a signal generated by reproducing and full wave rectifying the tracking servo pattern of FIG. 1A during proper tracking conditions.
Figure 1C:
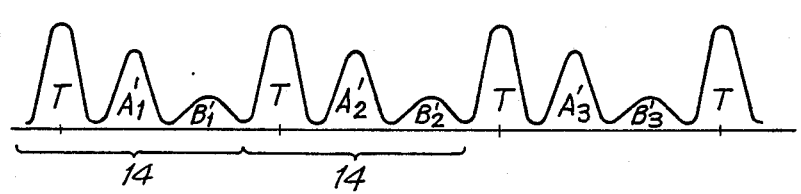
FIG. 1C is a waveform of a signal generated by reproducing and full wave rectifying the tracking servo pattern of FIG. 1A under mistracking conditions.

Referring now to the drawings and initially to FIGS. 1A–1C thereof, one environment in which the present invention may be advantageously employed is a hard disk drive tracking servo control system in which a tracking servo pattern is recorded in a dedicated servo area and is reproduced by a magnetic reproducing head of the device (commonly referred to as the servo head) to provide tracking control information. In accordance with a known technique, the magnetic heads used to record and/or reproduce useful information (known as the read/write heads) are ganged with the servo head such that when the servo head is tracking properly, the read/write heads are also tracking properly. Alternatively, the same read/write heads are used for both the recording/reproducing and servo functions, as in an imbedded servo system.

FIG. 1A schematically illustrates a tracking control servo pattern 10 in the form of a magnetization pattern, drawn linearly. Servo pattern 10 is a repeating pattern divided into successive cycles 12. As indicated by the symmetries of each cycle 12 of servo pattern 10, the signal generated when tracking pattern 10 is reproduced and full wave rectified with respect to a reference voltage VREF may be generally decomposed into cycles 14 having three pulses (FIG. 1B). Referring to the first cycle 14, these pulses include an initial timing pulse T of relatively large magnitude and two tracking pulses A1 and B1 having magnitudes indicative of the tracking condition of the reproducing head. As shown in FIG. 1B, this cycle 14 of an initial timing pulse T and tracking pulses A and B is repeated as the servo head scans along the servo track, reflecting cycles 12 of repeated servo pattern 10 of FIG. 1A.

When the servo head is tracking properly and scans along a center line 16 of the servo data (see FIG. 1A), tracking pulse A1 has a peak magnitude equal to that of tracking pulse B1, as indicated by the dotted lines in FIG. 1B, and the same relationship holds true for the respective magnitudes of tracking pulses A2 and B2, A3 and B3, and A4 and B4 in the successive cycles 14. However, when the servo head is in a mistracking condition, that is, when it is not properly centered on center line 16 of the servo data from which it is reproducing signals, the magnitude of the two tracking pulses A1, B1 will differ. Thus, when the reproducing head is displaced to one side of center line 16 of the servo data, the magnitude of tracking pulse A1' is increased, while the magnitude of tracking pulse B1' is decreased (see FIG. 1C), yielding a disparity in magnitude which is indicative of the erroneous displacement of the servo head from center line 6 of the servo data. If the servo head were displaced to the other side of center line 16, the magnitude of tracking pulse B1' would be increased and the magnitude of tracking pulse A1' would be correspondingly decreased. The tracking pulses in the following cycles 14, A2' and B2', A3' and B3', and A4' and B4', will continue to manifest the same disparity in magnitude for as long as the servo head is displaced by the same distance from center line 16 of the servo data. Therefore, an accurate measurement of the disparity can be used to accurately calculate the position of the servo head relative to the servo data and to correct any erroneous displacement thereof from center line 16 of the servo data thereof. The circuitry and methodology of calculating the tracking error signal from the disparity as well as the remaining portions of the tracking servo system do not form a part of the present invention per se, which is directed towards apparatus and a method for detecting a true average of tracking pulse samples and which may advantageously be employed to average corresponding A and B tracking pulses in the successive cycles 14 to obtain a more precise measurement of the disparity.

Averaging is desirable because the signals generated by the servo head both under proper tracking conditions, as illustrated in FIG. 1B, and under mistracking conditions, as illustrated in FIG. 1C, may include noise spikes or other error components generated, for example, by defects either in the recording of servo pattern 10 itself or in the reproducing operation of the servo head. It is therefore known to use a small number, for example four, of the corresponding tracking pulses A1–A4 and B1–B4 to provide more accurate values of the heights of the two tracking pulses in which the effect of a noise spike or other noise component is consequently diminished. However, a conventional peak detector will tend to hold the highest value, which in error conditions will be the magnitude of the noise spike. If the peak detector has a permitted amount of leakage or current limitation to reduce a held value toward the average, these measures will generally not be sufficient to reduce a noise spike to an acceptable value without degrading the performance of the peak detector, particularly in regard to its slew rate or droop rate. On the other hand, conventional true integrating averaging circuits generally employ an integrating capacitor which, when combined with the resistive elements of the integrating circuit, has a time constant which must be long with respect to the rise time of the sampled pulses in order to avoid the error introduced by noise spikes. Therefore, a true integrating system requires a large number of samples to reach a true average value.

The present invention provides a method and apparatus for detecting a true average of a number n of pulse samples where n may be a small number such as four. The apparatus according to the present invention is therefore highly advantageous for use in a tracking servo control system of the type described above. The present invention is not limited to this environment, of course, and further is not limited to averaging processes in which n is a small number. Rather, n may be any integer number greater than 1 in a particular averaging application. However, by presenting a true average for any number of samples, regardless of how small the number is, and by concurrently providing an averaging dilution of any noise spikes, the apparatus and method according to the present invention are particularly advantageous in environments where both speed and accuracy are considerations.

Figure 2:
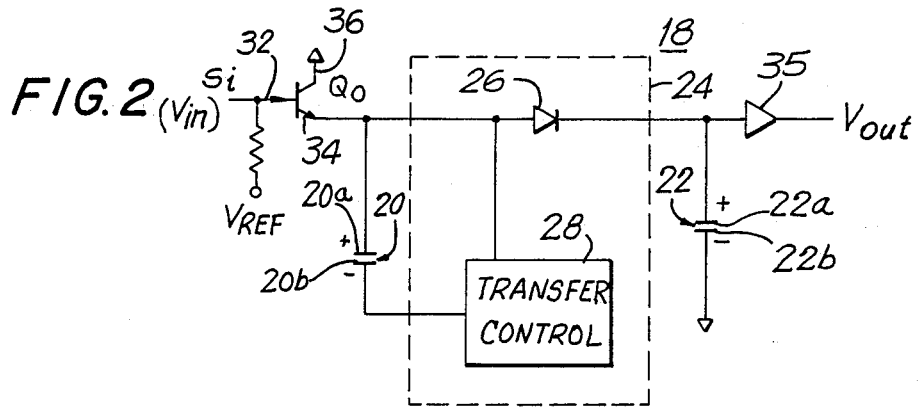
FIG. 2 is a schematic diagram of a preferred embodiment of the present invention.

Referring now to FIG. 2, the basic components of the averaging apparatus 18 according to the present invention comprise an input capacitor 20, an output capacitor 22 and a transfer control 24 for transferring samples, such as voltage samples, stored on input capacitor 20 to output capacitor 22 whereat the transferred samples accumulate. Capacitor 20 has a capacitance C and output capacitor 22 has a capacitance equal to nC, where n the number of voltage samples which will be averaged by averaging circuit 18.

The theory underlying the present invention is as follows. Voltage samples S1-Sn, for example samples extracted from the reproduced tracking signal of FIG. 1B or FIG. 1C and detected at the peak of each tracking pulse A1-A4 (A1'-A4'), are successively presented to and stored one at a time on input capacitor 20. Each voltage sample Si has a voltage value Vi. During storage of each sample Si, diode 26 within transfer control 24 is rendered nonconductive by a transfer control circuit 28 of transfer control 24. Diode 26 is always operative to prevent reverse charge transfer from output capacitor 22 to input capacitor 20. As is well known, first voltage sample S1 is stored in the form of charge q1 on input capacitor 20. The charge q1 stored on input capacitor 20 by virtue of the first voltage sample S1 is related to capacitance C and the voltage V1 of first voltage sample S1 by the well-known formula $$V1 = q1/C.$$

Correspondingly then, $$q1 = V1 \times C.$$

After the first sample S1 is stored and before the second sample S2 is presented for storage, transfer control circuit 28 renders diode 26 conductive and forces all the charge stored on input capacitor 20 to be transferred to output capacitor 22. During such transfer of first voltage sample S1 from input capacitor 20 to output capacitor 22, that is, during transfer of q1, this charge q1 is conserved. Since capacitance nC of output capacitor 22 is n times greater than capacitance C of input capacitor 20, the resultant output voltage Vout presented by output capacitor 22 as a result of q1 is $$Vout = V1/n,$$

since $q1 = V1 \times C = V2 \times nC = (V2 \times n) \times C$.

In other words, voltage Vout on output capacitor 22 in response to charge q1 will be (1/n)th the voltage previously appearing across input capacitor 20 in response to charge q1. After charge q1 is fully transferred to output capacitor 22, transfer control circuit 28 turns off diode 26 (i.e. renders the diode nonconductive) and the second voltage sample S2 now is stored on input capacitor 20. Transfer control circuit 28 then again turns on diode and forces all the charge q2 stored on input capacitor 20 in response to sample S2 to be transferred to output capacitor 22 while preventing any discharge of output capacitor 22, so that charge q2 is added to charge q1. Therefore, after n samples Si have been successively presented to and stored on input capacitor 20 and have been transferred to output capacitor 22, the total charge on output capacitor 22 will be $$Qtot = q1 + q2 + \ldots + qn$$

and the voltage Vout will be $$\begin{aligned} Vout &= (q1 + q2 + \ldots + qn)/nC \\ &= (1/n)(q1 + q2 + \ldots + qn)/C \\ &= (1/n)(V1 + V2 + \ldots + Vn). \end{aligned}$$

I.e., voltage Vout presented on output capacitor 22 will be the average of the voltages Vi of the n samples Si. This is a true average regardless of the number n of samples.

Figure 3:
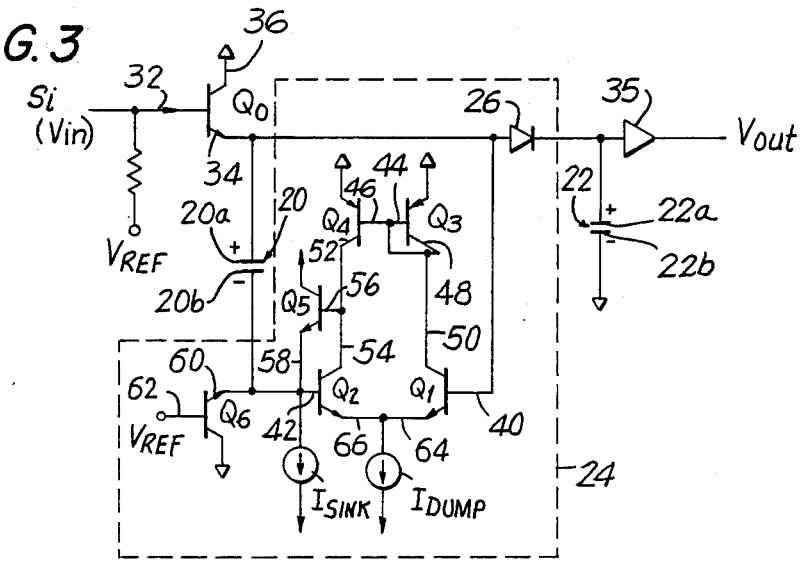
FIG. 3 is a wiring diagram of an important part of the preferred illustrated in FIG. 2.

The operation of transfer control 24 is timed in coordination with the operation of input circuitry so as to ensure that the successive voltage samples Si are stored on input capacitor 20 and transferred to output capacitor 22 without interfering with each other. An advantageous input circuit which may be used in combination with the preferred embodiment is illustrated in FIG. 3. A peak detector circuit including an input transistor Q0 and input capacitor 20 receives the reproduced tracking signal corresponding to the waveforms illustrated in FIGS. 1B and 1C, and is operative to detect the peaks of tracking pulses A1-A4 (A1'-A4') or tracking pulses B1-B4 (B1'-B4'). The tracking servo system itself generally includes two averaging circuits 18 of the type illustrated in FIG. 2, one to calculate the average of tracking pulses A1-A4 (A1'-A4') and one to calculate the average of tracking pulses B1-B4 (B1'-B4').

In FIG. 2, transistor Q0 is an npn transistor having a control base electrode 32 (the "base") and current-carrying emitter and collector electrodes 34, 36 (the "emitter" and the "collector"). Emitter 34 is connected to electrode 20a of input capacitor 20 and base 32 is connected to receive voltage samples Si, which are the pulses rectified with respect to a selected voltage VREF (FIGS. 1B and 1C). Voltage VREF may be any practical value associated with transistor operation, e.g. 3V, 5V etc.

Therefore, when first voltage sample S1 is presented at base 32, the voltage appearing on emitter 34 will be V1-Vbe0, where Vbe0 is the base emitter voltage of transistor Q0. Transistor Q0 has its collector 36 connected to a power supply (not illustrated). Transistor Q0 is made conductive by the positive voltage sample Si only at specific times when transfer control 24 isolates input capacitor 20 from output capacitor 22, and transistor Q0 is held nonconducting at all other times. It will be apparent to those skilled in the art that different input circuitry other than input transistor Q0 may be employed depending on the particular application and environment of averaging circuit 18.

In accordance with known techniques, output voltage Vout presented at output capacitor 22 may be transferred to a buffer 38. Input capacitor 20 is reset, such as to a negative voltage, by transfer control 24 after each voltage sample Si has been transferred to output capacitor 22, as will be described below.

Turning now to FIG. 3, a preferred structure for transfer control circuit 28 includes four npn transistors Q1, Q2, Q5 and Q6 and two pnp transistors Q3 and Q4 which, together with constant current sources IDUMP and ISINK and a source of the reference voltage VREF comprise a feedback loop connected to electrodes 20a, 20b of input capacitor 20 for selectively forward biasing diode 26 to transfer all charge from input capacitor 20 to output capacitor 22 and for selectively back biasing diode 26 to isolate input capacitor 20 from output capacitor 22 during storage of the voltage samples Si on capacitor 20. As shown in FIG. 3, transistors Q1 and Q2 are differentially connected with their bases 40, 42 connected to electrodes 20a and 20b, respectively, of input capacitor 20. Transistors Q3 and Q4 have their bases 44, 46 connected together, with the collector 48 of transistor Q3 being connected to the commonly connected bases 44, 46 and also to the collector 50 of transistor Q1. Transistor Q4 has its collector 52 connected to the collector 54 of transistor Q2 and also connected to the base 56 of transistor Q5. Base 42 of transistor Q2 is connected to the emitter 58 of transistor Q5 and the emitter 60 of transistor Q6, which receives the reference voltage VREF at its base 62. Constant current source ISINK is always on and is connected to base 42 of transistor Q2, while constant current source IDUMP is connected to the commonly connected emitters 64, 66 of transistors Q1 and Q2 and is selectively made on or off, for example by conventional switching circuitry (not illustrated), to control the transfer/isolation operation of transfer control circuit 28.

Before each averaging operation, output capacitor is reset by conventional circuitry to a predetermined initial value which is more positive than the largest expected voltage Vi of any input voltage sample Si so that diode 26 will not be forward biased during the storage operation. Therefore, the output voltage on output capacitor 22 is in fact equal to the average of the input voltage samples Vi, plus the initial value and minus Vbe0. However, this initial value and Vbe0, being predetermined, may be compensated for in subsequent processing. Indeed, in the environment of the tracking servo system as described above, the average calculated for the tracking pulses B1-B4 is subtracted from the average calculated for the tracking pulses A1-A4, and so this initial value added to each average and the offset Vbe0 are automatically cancelled. During the reset operation for output capacitor 22, diode 26 will automatically be back biased and so this resetting operation will not affect input capacitor 20.

The transfer/isolation operation is as follows. Before storage of each sample Si, input capacitor 20 is reset to a negative voltage as described below, while output capacitor 22 presents either its initial voltage value or has a positive voltage equal to the sum of the initial value and the voltage due to the charges from one or more previously received input voltage samples Si divided by n. Therefore, diode 26 is back biased. During the storage operation, IDUMP is turned off. ISINK, which is always on, generally is relatively high, for example, at least twice the current expected to flow through input transistor Q0 to input capacitor 20. Transistor Q6 is on and its emitter voltage remains constant and is one Vbe (approximately 0.6 volts) less than VREF applied to base electrode 62 of transistor Q6. (It will be appreciated that by conventional manufacturing techniques Vbe of all of the illustrated transistors may be made equal). VREF limits the negative swing on input capacitor 20 through transistor Q6 to the zero value of the input samples, which here is the rectifying value. Therefore, input capacitor 20 charges to $VC = Vi - Vbe0$ through ISINK.

When storage is complete, the charge qi on input capacitor 20 is transferred to output capacitor 22: IDUMP is turned on and increases (for example, substantially stepwise) to its constant current. The voltage Vb1 at base 40 of transistor Q1 is initially higher than the voltage Vb2 at base 42 of transistor Q2 (since $Vb1 - Vb2 = VC$, the voltage on input capacitor 20) and the circuit including transistors Q3, Q4 and Q5 acts as a feedback circuit. In particular, when IDUMP is on, feedback circuit Q1-Q5 attempts to force Vb2 to be equal to Vb1, which means that Vb2 rises. Transistor Q5 supplies current to base 42 of transistor Q2 to increase Vb2. As Vb2 rises, however, input capacitor 20 tries to hold its voltage VC constant. To the extent that VC is held constant, i.e. to the extent that no current is drawn from input capacitor 20, the voltage at electrode 20a of input capacitor 20, which is Vb1, also rises. Thus voltage Vb2 "chases" voltage Vb1, but cannot catch it until current can flow from electrode 20a. A small base current does flow from electrode 20a to the base of transistor Q1, resulting in a slight drop in VC, but transistor Q1 is active, so its base current is small and the drop during this time interval can be made negligible. The only other path for the charge qi to flow is from input capacitor 20 to output capacitor 22 through diode 26. Therefore, when Vb1 rises to the point where diode 26 is forward biased, the entire charge qi is transferred to output capacitor 22. Current flows until Vb1=Vb2, i.e. VC=0, which occurs almost instantaneously. This completes the charge transfer.

During the transfer operation, the level of IDUMP is not relevant to the operation of the circuit provided transistors Q1 and Q2 are held on. As Vb2 rises, transistor Q6 turns off when VREF−Vb2 is less than Vbe.

IDUMP remains on even after VC=0. The feedback loop Q1-Q5 is momentarily satisfied with Vb1=Vb2, but the small base current continues to flow from electrode 20a of input capacitor 20 to base 40 of transistor Q1. Hence, the voltage at electrode 20a now slowly drops below the voltage at electrode 20b, i.e. the voltage VC across input capacitor 20 is negative. Diode 26 therefore is back biased and turns off. Now Vb1 is less than Vb2 and the feedback loop functions to reduce Vb2 with Vb1, with Vb2 chasing but never catching Vb1. As Vb2 is decreases, VREF−Vb2 will become equal to Vbe, at which point transistor Q6 turns on again and clamps the emitter voltage of transistor Q5 to a voltage such that Vb5-Ve5 is less than Vbe. Hence, transistor Q5 turns off and the feedback loop is opened. Transistors Q1 and Q2 no longer function as a differential amplifier, but transistor Q0 turns on, since its emitter voltage has dropped by Vbe below its base voltage, and supplies a base current to transistor Q1, and so the voltage Vb1 at electrode 20a of input capacitor 20 is no longer reduced. IDUMP may then be turned off. It is preferable to have IDUMP off when each voltage sample Si is being supplied to input transistor Q0 because otherwise as a voltage sample Si starts to charge input capacitor 20, there is the risk diode 26 will erroneously turn on and transfer a portion of voltage sample Si therethrough to output capacitor 22.

The present invention has been described in connection with a single preferred embodiment, but it will be apparent to one skilled in the art that many changes and modifications may be made therein without departing from the spirit or scope of the present invention. For example, the capacitance of output capacitor 22 may be k times the capacitance of input capacitor 20, where k can have any value. The output voltage is then the true average times a gain factor of n/k, where n/k may be greater or less than 1 to provide a selected gain or attenuation. For example, when k=n, the gain is 1 and the output is the true average value. Therefore, the scope of the present invention should be determined by reference to the appended claims.

What is claimed is:

1. Apparatus for detecting a true average of n signal samples, where n is an integer greater than 1, comprising:
   an input capacitor having a first capacitance for successively storing said n signal samples;
   an output capacitor having a second capacitance equal to said first capacitance multiplied by a constant k for presenting an output voltage; and
   transfer means for transferring each of said n samples from said input capacitor to said output capacitor for accumulating successive samples on said output capacitor, whereby after transfer of the n samples said output capacitor presents an output voltage equal to a true average of said n voltage samples times a gain factor equal to n/k.

2. Apparatus according to claim 1, wherein n=k.

3. Apparatus according to claim 1, further comprising input means for supplying said samples to said input capacitor at respective first times, an wherein said transfer means is operative to transfer charges corresponding to each of said samples to said output capacitor at a respective second time intermediate its respective first time and the first time of a next following sample.

4. Apparatus for detecting a true average of n signal samples, where n is an integer greater than 1, comprising:
input capacitor means having a first capacitance for successively storing said n signal samples;
output capacitor means having a second capacitance equal to said first capacitance multiplied by a constant k for presenting an output voltage;
transfer means for transferring each of said n samples from said input capacitor means to said output capacitor means for accumulating on the latter, whereby after transfer of the n samples said output capacitor means presents an output voltage equal to a true average of said n voltage samples times a gain factor equal to n/k;
input means for supplying said samples to said input capacitor means at respective first times and including an input transistor made conductive at said first times and non-conductive at all other times; and wherein said transfer means is operative to transfer charges corresponding to each of said samples to said output capacitor means at a respective second time intermediate its respective first time and the first time of a next following sample.

5. Apparatus for detecting a true average of n signal samples, where n is an integer greater than 1, comprising:
input capacitor means having a first capacitance for successively storing said n signal samples;
output capacitor means having a second capacitance equal to said first capacitance multiplied by a constant k for presenting an output voltage; and
transfer means for transferring each of said n samples from said input capacitor means to said output capacitor means for accumulating on the latter, whereby after transfer of the n samples said output capacitor means presents an output voltage equal to a true average of said n voltage samples times a gain factor equal to n/k, said transfer means including reset means operative upon transfer of each of said samples for resetting said input capacitor means.

6. Apparatus according to claim 1, wherein said transfer means includes switch means connected between said input and output capacitor for preventing charge transfer from said output capacitor to said input capacitor.

7. Apparatus for detecting a true average of n signal samples, where n is an integer greater than 1, comprising:
input capacitor means having a first capacitance for successively storing said n signal samples;
output capacitor means having a second capacitance equal to said first capacitance multiplied by a constant k for presenting an output voltage; and
transfer means for transferring each of said n samples from said input capacitor means to said output capacitor means for accumulating on the latter, whereby after transfer of the n samples said output capacitor means presents an output voltage equal to a true average of said n voltage samples times a gain factor equal to n/k, said transfer means including diode means connected between said input and output capacitor means for preventing charge transfer from said output capacitor means to said input capacitor means, and means for back biasing said diode means during storage of each of said samples on said input capacitor means and for forward biasing said diode means during transfer of each of said samples.

8. Apparatus for detecting a true average of n signal samples, where n is an integer greater than 1, comprising:
input capacitor means having a first capacitance for successively storing said n signal samples;
output capacitor means having a second capacitance equal to said first capacitance multiplied by a constant k for presenting an output voltage;
transfer means for transferring each of said n samples from said input capacitor means to said output capacitor means for accumulating on the latter, whereby after transfer of the n samples said output capacitor means presents an output voltage equal to a true average of said n voltage samples times a gain factor equal to n/k;
each of said input and output capacitor means including respective first and second electrodes;
diode means connected between the respective first electrodes of said input and output capacitor means; and
said transfer means including feedback means connected to the first and second electrodes of said input capacitor means for selectively forward biasing said diode means for permitting transfer from said input capacitor means to said output capacitor means and for selectively back biasing said diode means for preventing charge transfer from said input capacitor means to said output capacitor means.

9. Apparatus according to claim 8, wherein said feedback means includes first and second differentially connected transistors having respective control electrodes connected to said first and second electrodes of said input capacitor means and respective first current carrying electrodes connected together, third and fourth transistors having respective control electrodes connected together and respective first current carrying electrodes connected to respective second current carrying electrodes of said first and second transistors, respectively, said third transistor having its control electrode and first current carrying electrode connected together, a fifth transistor having a control electrode connected to said second current carrying electrode of said second transistor and a first current carrying electrode connected to said control electrode of said second transistor, a sixth transistor having a control electrode connected to receive a reference voltage and a first current carrying electrode connected to said control electrode of said second transistor, a continuously on first constant current source connected to said control electrode of said second transistor and a second constant current source connected to the connected first current carrying electrodes of said first and second transistors, said second constant current source being turned on selectively to cause transfer of each said samples from said input capacitor means to said output capacitor means.

10. Apparatus according to claim 1, further comprising buffer means for receiving said output voltage from said output capacitor.

11. A method for detecting a true average of n voltage samples, where n is an integer greater than 1, comprising the steps of:
   successively storing said n samples on an input capacitor having a first capacitance;
   transferring each of the stored samples from said input capacitor to an output capacitor having a capacitance equal to said first capacitance multiplied by a constant k for accumulating on said output; capacitor; and
   detecting a voltage on said output capacitor.

12. A method according to claim 11, wherein k=n.

13. A method according to claim 11, further comprising the step of resetting said input capacitor following transfer of each of the stored samples from the input capacitor and before storage of a next following voltage sample.

14. In servocontrol apparatus of a hard disk drive device in which pulses reproduced from tracking servo patterns are averaged to provide a tracking control signal, the improvement comprising apparatus for detecting true average of n respective samples of said pulses, where n is an integer greater than 1, comprising:
   an input capacitor having a first capaciance for successively storing n respective samples of said pulses;
   an output capacitor having a second capacitance equal to said first capacitance multiplied by a constant k for presenting an output voltage; and
   transfer means for transferring each of said n samples from said input capacitor to said output capacitor for accumulating on said output capacitor, whereby after transfer of the n samples said output capacitor presents an output voltage equal to a true average of said n samples times a gain factor equal to n/k.

15. Servocontrol apparatus according to claim 14, wherein k=n.

* * * * *

UNITED STATES PATENT AND TRADEMARK OFFICE
CERTIFICATE OF CORRECTION

PATENT NO. : 4,868,470

DATED : September 19, 1989

INVENTOR(S) : Nicholas J. Bucska and David E. Norton, Jr.

It is certified that error appears in the above-identified patent and that said Letters Patent is hereby corrected as shown below:

Claim 3, column 9, line 9, change "an" to --and--.

Claim 8, column 10, line 39, after "permitting" insert --charge--.

Claim 11, column 11, line 18, after "output" delete the semicolon (;).

Claim 14, column 12, line 7, before "true average" insert --a--;

line 9, correct the spelling of "capacitance".

Signed and Sealed this

Fourteenth Day of August, 1990

Attest:

HARRY F. MANBECK, JR.

*Attesting Officer*  *Commissioner of Patents and Trademarks*